United States Patent [19]

Yamauchi

[11] Patent Number: 5,065,201
[45] Date of Patent: Nov. 12, 1991

[54] SEMICONDUCTOR MEMORY DEVICE

[75] Inventor: Yoshimitsu Yamauchi, Nara, Japan

[73] Assignee: Sharp Kabushiki Kaisha, Osaka, Japan

[21] Appl. No.: 488,874

[22] Filed: Mar. 6, 1990

[30] Foreign Application Priority Data

Mar. 14, 1989 [JP] Japan .................................... 1-62873

[51] Int. Cl.$^5$ ..................... H01L 29/68; H01L 29/78
[52] U.S. Cl. .................. 357/23.5; 357/23.6; 357/51; 365/185
[58] Field of Search ....................... 357/23.5, 23.6, 51; 365/185

[56] References Cited

U.S. PATENT DOCUMENTS

| 4,742,491 | 5/1988 | Liang et al. | 365/185 |
| 4,835,741 | 5/1989 | Baglee | 365/185 |
| 4,866,493 | 9/1989 | Arima et al. | 357/23.5 |
| 4,924,278 | 5/1990 | Logie | 357/23.5 |

FOREIGN PATENT DOCUMENTS

| 2720533 | 11/1978 | Fed. Rep. of Germany | 357/23 |
| 59-4158 | 1/1984 | Japan | 357/23.6 |

OTHER PUBLICATIONS

*A Novel NVRAM Cell Technology for High Density Applications*, by Y. Yamauchi, K. Tanaka and K. Sakiyama, published in Dec. 1988.

*Primary Examiner*—Jerome Jackson, Jr.
*Assistant Examiner*—Donald L. Monin, Jr.
*Attorney, Agent, or Firm*—Sandler, Greenblum, & Bernstein

[57] ABSTRACT

A semiconductor device includes a DRAM section constituting one MOS transistor and one capacitor, and an EEPROM section constituting one FLOTOX MOS transistor. A control gate electrode of the FLOTOX MOS transistor is connected to a source area of the MOS transistor of the DRAM section, on which is placed a capacitor electrode through an insulation layer, so that the control gate is made a storage node of the DRAM section. Thus, a combination of EEPROM cell and DRAM cell provides a NVRAM cell. When a data change is desired, the NVRAM cell works as DRAM. On the other hand, when data is to be preserved for a longer time, the data is transferred from DRAM section to EEPROM section by the NVRAM cell to be stored in EEPROM section. Since the capacitor of DRAM section has its storage node in common with a control gate of EEPROM section, the number of elements per cell can be reduced, thereby satisfying the requirement for applications of NVRAM cell to high density devices.

13 Claims, 2 Drawing Sheets

| OP MODE | BIAS | | | | | c.f. |
|---|---|---|---|---|---|---|
| | Term'l 1 | Term'l 2 | Term'l 6 | Term'l 7 | | |
| INITIAL SET | V1 | ∅ | ∅ | V7 | | Qf is charged in floating gate |
| DRAM | Vcc/0 | OPEN | ∅ | V7 | | Qs is charged in the storage node when Vcc is applied |
| DRAM→EEPROM TRANSFER | ∅ | V2 | ∅ | ∅ | | |

Fig. 4
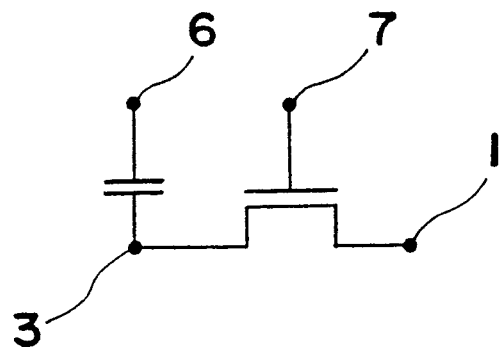
Fig. 5
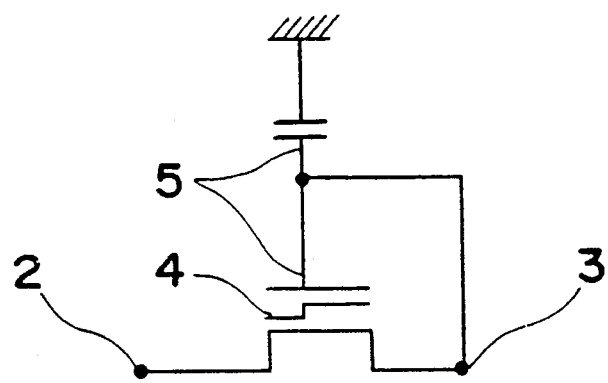
Fig. 6
| DRAM DATA | Threshold of MT after the transfer |
|---|---|
| "1" | High |
| "0" | Low |

SEMICONDUCTOR MEMORY DEVICE

BACKGROUND OF THE INVENTION

1. Field of the Invention

The present invention relates to a semiconductor device which can operate as a dynamic RAM and also as an EEPROM.

2. Description of the Prior Art

In general, a memory device which retains stored data even after the cut-off of power is called a nonvolatile memory (such as an EEPROM, which stands for Electrically Erasable/Programmable Read Only Memory), while a memory device which permits earasing of the stored data by the power cut off is called a volatile memory (such as a RAM, or the like).

Although the nonvolatile memory EEPROM can retain the stored data for a long period of time even after the power is cut off, it takes a relatively long time, such as about 10 msec, for the EEPROM to do perform the writing or erasing of data. Also, the number of times the EEPROM can carry out the writing and erasing operations is limited. Therefore, the EEPROM is not suitable for use in apparatuses that change data frequently.

On the other hand, a RAM which is a volatile memory, requires a very short time, such as 100 nsec, to do the data writing or erasing. Also, there is no limit to the number of times the RAM can to carry out the data writing or erasing. However, RAM has an inconvenience since the stored data is erased if the power is cut off.

In consideration of the above, a nonvolatile RAM (NVRAM) cell has been proposed which is a combination of an EEPROM cell and RAM cell, thereby enabling frequent data change, with a capability of holding the changed data for a long time.

One type of the aforementioned conventional NVRAM combines an EEPROM with a SRAM or DRAM, with the latter having a reduced cell size with respect to the former.

However, even the NVRAM formed by combining an EEPROM with a DRAM cannot achieve the still smaller cell size required for high density devices, and therefore it is not suitable for applications requiring high density.

SUMMARY OF THE INVENTION

Accordingly, an essential object of the present invention is to provide an improved cell structure for a NVRAM which is a combination an of EEPROM and a DRAM, resulting in the realization to of a reduction of the cell size.

In accomplishing the above-described object, according to the present invention, a semiconductor device is provided which is comprised of a DRAM section constituted by one MOS transistor and one capacitor and an EEPROM section constituted by one FLOTOX MOS transistor. A control gate electrode of the FLOTOX MOS transistor is connected to a source area of the MOS transistor of the DRAM section, on which is placed a capacitor electrode through an insulation layer, so that the control gate is made a storage node of the DRAM section.

As a result of an the combination of EEPROM cell with a DRAM cell, the semiconductor device operates as a DRAM when data is to be frequently exchanged whereas it functions to store data as an EEPROM when a long time preservation of data is required. In storing the data as an EEPROM, the entire data is transferred simultaneously from the DRAM section to the EEPROM section. Since the DRAM section includes one MOS transistor and one capacitor of a stack structure, and since the capacitor has its storage node in common with the control gate of the EEPROM section, the NVRAM cell is of such a simple structure that the capacitor is laminated over the EEPROM section. Accordingly, the number of elements per cell is minimized, resulting in a novel NVRAM of a smaller cell size than a conventional NVRAM.

BRIEF DESCRIPTION OF THE DRAWINGS

These and other objects and features of the present invention will become apparent from the following description taken in conjunction with one preferred embodiment thereof with reference to the accompanying drawings throughout which like parts are designated by like reference numerals, and in which:

FIG. 4 is an equivalent circuit diagram in the case where the bias conditions are for DRAM mode;

FIG. 5 is an equivalent circuit diagram in the case where the bias conditions are for transfer mode; and FIG. 6 is a table showing a relationship between stored data and a threshold value of a transistor MT after the data transfer according to the one preferred embodiment.

DESCRIPTION OF THE PREFERRED EMBODIMENT

Figures 1, 2:
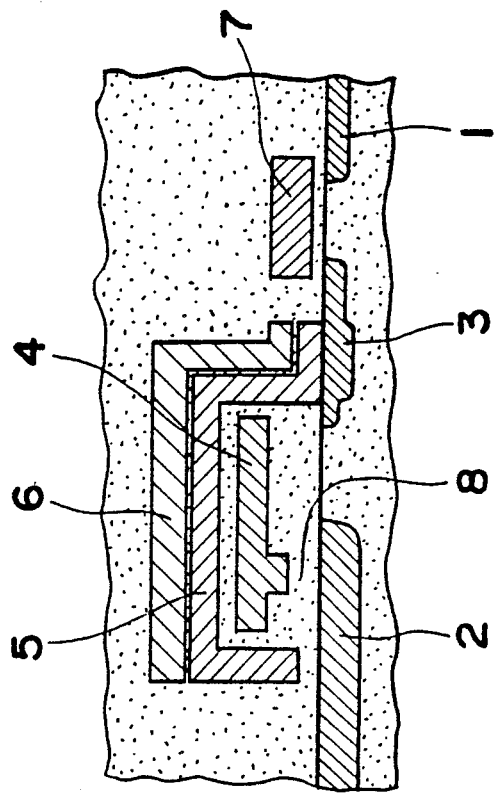
FIG. 1 is a circuit diagram of a cell of a semiconductor device according to one preferred embodiment of the present invention.
FIG. 2 is a cross-sectional view showing the structure of the cell of the semiconductor device of FIG. 1.

Referring to FIG. 1, a circuit diagram of a cell of a semiconductor device according to one preferred embodiment of the present invention is shown. The structure of this cell is understood from a cross-sectional view shown in FIG. 2 in which reference numbers 1, 2 and 3 are diffused areas in a silicon substrate, and 4, 5, 6 and 8 are electrodes formed, for example, by deposition with suitable insulation layers, e.g., $SiO_2$ layer, inserted between the electrodes.

The cell in FIG. 1 includes a DRAM section and an EEPROM section. The DRAM section is comprised of a MOS transistor T (referred to as a transistor T hereinafter) and a capacitor C in a stack structure. The EEPROM section is comprised of a FLOTOX-type MOS transistor MT (referred to as a transistor MT hereinafter).

Transistor T has a gate electrode 7 which is connected to a word line, and a drain diffusion layer 1 which is connected to a bit line. Capacitor C is formed in a stack structure having an insulation layer inserted between a plate capacitor electrode 6 and a storage node (control gate electrode) 5. Storage node 5 is connected to a source diffusion layer 3 of transistor T.

Transistor MT is provided with a floating gate electrode 4 for storing data for a long time, a tunneling insulation layer 8 between electrode 4 and a substrate diffusion layer, and control gate electrode 5.

The operation of the memory cell will be described below.

Figure 3:
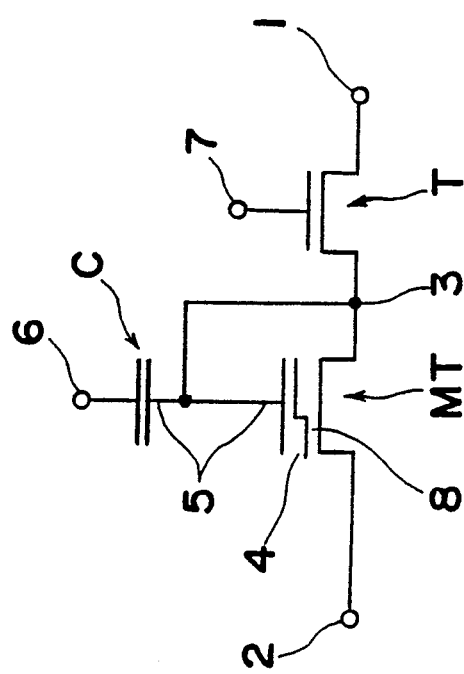
FIG. 3 is a table showing bias conditions in the cell according to one preferred embodiment.

First, the biasing conditions indicated in the table of FIG. 3 are set as an initial setting mode. Thus, source diffusion layer 2 (terminal 2) of transistor MT is grounded (0 level), so that a terminal at the substrate side of tunneling insulation layer 8 becomes grounded. Also, plate capacitor electrode 6 (terminal 6) is grounded. In this state, a positive bias voltage (V7) is applied to word selection gate electrode 7 thereby to turn on transistor T causing a positive bias voltage (V1) to be applied to drain diffusion layer 1 (terminal 1). Accordingly, electrons are injected to floating gate electrode 4 from the side of the substrate, with a result such that electric charge Qf is accumulated in floating gate electrode 4. Thus, the threshold voltage of transistor MT is increased (higher than source voltage Vcc).

If the biasing conditions are changed to the DRAM mode after the initial mode, terminal 2 opens while terminals 6 and 7 are maintained as they are. In this case, the equivalent circuit will be as shown in FIG. 4, which is substantially the same as that of a DRAM consisting of one transistor and one capacitor. Then, source voltage Vcc or 0 volt is applied to terminal 1. When Vcc is applied, an electric charge Qs is accumulated in the storage node.

Thereafter, the biasing conditions are changed to data transfer mode for transferring data from the DRAM to the EEPROM. In this case, terminals 1, 6 and 7 are grounded, and terminal 2 is applied with a voltage V2, so that data is transferred. The equivalent circuit for this mode is shown in FIG. 5.

In the circuit shown in FIG. 5, the following equations are satisfied:

$$C_{45}(V_4 - V_5) + C_{24}(V_4 - V_2) = Qf \quad (1)$$

$$C_{56}(V_5) + C_{45}(V_5 - V_4) = Qs \quad (2)$$

wherein:

$V_i$ is a potential at a position indicated by a reference number i;

$C_{ij}$ is a capacitance between elements with reference numbers i and j;

Qf is an electric charge accumulated in floating gate electrode 4; and

Qs is an electric charge accumulated in capacitor C at DRAM mode.

From the above equations (1) and (2), the following equation (3) is obtained:

$$V_4 = \frac{(C_{45} + C_{56})(C_{24}V_2 + Qf) + C_{45}Qs}{(C_{24} + C_{45})\left(C_{56} + \frac{1}{\frac{1}{C_{24}} + \frac{1}{C_{45}}}\right)} \quad (3)$$

Supposing that the capacitance of capacitor C of DRAM section is increased to 60 fF so as to obtain $$C_{56} >> \frac{1}{1/C_{24} + 1/C_{45}},$$

an equation $$V_4 = \frac{(C_{45} + C_{56})(C_{24}V_2 + Qf) + C_{45}Qs}{C_{56}(C_{24} + C_{45})} \quad (4)$$

is obtained. Therefore, the voltage $Vox = V_2 - V_4$ applied to tunneling insulation layer 8 of transistor MT at the initial stage of the data transfer results in as follows:

(i) In the case where the data stored in the DRAM mode (hereinafter referred to as DRAM data) is "1", it is assumed that $Vox = Vox_1$ and $Qs = C_{56}Vcc$, $$Vox_1 = \frac{C_{45}}{C_{24} + C_{45}}(V_2 - Vcc) - \frac{(C_{45} + C_{56})Qf}{C_{56}(C_{24} + C_{45})} \quad (5)$$

is obtained.

(ii) in the case where DRAM data shows "0", it is assumed that $Vox = Vox_0$ and $Qs = 0$. Thus, $$Vox_0 = \frac{C_{45}}{C_{24} + C_{45}}V_2 - \frac{(C_{45} + C_{56})Qf}{C_{56}(C_{24} + C_{45})} \quad (6)$$

is obtained.

Accordingly, the difference of voltage $\Delta Vox$ applied to tunneling insulation layer 8 between when DRAM data shows "0" and "1" is:

$$\Delta Vox = Vox_0 - Vox_1 \quad (7)$$
$$= \frac{C_{45}}{C_{24} + C_{45}} Vcc.$$

Now, if the coupling ratio of transistor MT is set to be $$Rc = \frac{C_{45}}{C_{24} + C_{45}} = 0.64, \quad (8)$$

and if the source voltage Vcc and thickness Tox of tunneling insulation layer 8 are set respectively to be 5 volts and 80 Å, the difference between electric fields $Eox_0$ and $Eox_1$ applied to tunneling insulation layer 8 respectively for DRAM data "0" and "1" will result in such that:

$$\Delta Eox = Eox_0 - Eox_1 \quad (9)$$
$$= \frac{\Delta Vox}{Tox}$$
$$= \frac{RC}{Tox} Vcc$$
$$= 4(MV/cm)$$

From this, it is understood that the tunneling insulation layer is applied with 4 (MS/cm) higher electric field when DRAM data is "0" than when the it is "1".

If the current flowing from source area 2 to floating gate 4, when the electric field applied to the tunneling insulation layer is $Eox_0$ or $Eox_1$, is respectively represented by $Iox_0$ or $Iox_1$, an equation as follows $$\frac{Iox_0}{Iox_1} = \frac{Eox_0^2}{Eox_1^2} \cdot \frac{\exp(-B/Eox_0)}{\exp(-B/Eox_1)} \quad (10)$$
$$= \exp\{(1/Eox_1 - 1/Eox_0)B\}$$

is established. In equation (10), reference B is a constant and is equal to for example $3.35 \times 10^2$ as obtained from the measurement of I-V characteristics.

If $Eox_0$ is made equal to 11.5 (MV/cm), $Eox_1$ becomes equal to 7.5 (MV/cm) from equation (9). By substituting these values to equation (10), an equation (11) is obtained;

$$\frac{Iox_0}{Iox_1} = 1.31 \times 10^7. \quad (11)$$

It can be seen accordingly that more electrons are extracted to source area 2 from floating gate 4 in the case where DRAM data is "0" than for the DRAM data state of "1". Since the change of the threshold voltage due to the shift of electric charge stored in floating gate 4 of transistor MT is expressed by the following equation;

$$\Delta Vth = -\frac{\Delta Qf}{C_{45}} \quad (12)$$

the threshold voltage when DRAM data is "0" is lower than that when it shows "1".

Accordingly, the relationship between the DRAM data and the threshold value of transistor MT after the data transfer is uniformly determined, as shown in FIG. 6.

As has been described hereinabove, the semiconductor device of the present invention is outstanding in that an EEPROM cell is combined with a DRAM cell and therefore, the semiconductor device of the present invention can operate not only as a DRAM when data is to be frequently changed, but it can also operate as an EEPROM after the transfer of the entire data from the DRAM section to the EEPROM section, when long time data preservation is desired.

Moreover, since the DRAM section comprises by one MOS transistor and one capacitor of a stack structure, and since the capacitor of the DRAM section has the storage node in common with the control gate of the EEPROM section, the DRAM section can be provided over the EEPROM section, reducing the number of elements per cell to a minimum. Thus, a novel NVRAM structure having a smaller cell size than a conventional NVRAM and suitable for high density applications can be achieved.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A memory device, comprising:
    a DRAM section comprising a first MOS transistor and a capacitor, said DRAM section functioning to store data that is frequently changed;
    an EEPROM section comprising a second MOS transistor, said second MOS transistor having a control gate electrode connected to a source of said first MOS transistor for transferring data from said DRAM section to said EEPROM section, a floating gate electrode that is used for holding said data in said EEPROM section, a drain electrode that is connected to said source of said first MOS transistor and said control gate electrode of said second MOS transistor, and a source area, said EEPROM section functioning to store data when electrical power to said memory device is interrupted, said data to be stored being transferred from said DRAM section to said EEPROM section;
    an insulation layer formed over said control gate electrode; and
    a first capacitor electrode of said capacitor being provided over said insulation layer such that said control gate electrode is also a second capacitor electrode of said capacitor.

2. The memory device of claim 1, wherein said insulation layer comprises a silicon oxide layer.

3. The memory device of claim 1, further comprising a floating gate electrode that effects said storage of said data in said EEPROM section.

4. A memory device, comprising:
    a DRAM section, comprising:
        a capacitor and a first metal oxide semiconductor transistor having a gate connected to a word line, a drain connected to a bit line, and a source;
    an EEPROM section, comprising:
        a second metal oxide semiconductor transistor, said second metal oxide semiconductor transistor having a control gate electrode connected to said source of said first metal oxide semiconductor transistor for transferring data from said DRAM section to said EEPROM section, a floating gate electrode that is used for holding said data in said EEPROM section, a drain electrode that is connected to said source of said first metal oxide semiconductor transistor and said control gate electrode of said second metal oxide semiconductor, and a source area
        a first electrode of said capacitor of said DRAM section being connected to said source of said first metal oxide semiconductor transistor and said control gate electrode of said second metal oxide semiconductor, a second electrode of said capacitor being grounded when data is to be transferred from said DRAM section to said EEPROM section.

5. The memory device of claim 4, wherein said first electrode of said capacitor is provided over an insulation layer such that said control gate electrode of said second metal oxide semiconductor is also said second capacitor electrode of said capacitor.

6. The memory device of claim 4, wherein said second metal oxide semiconductor transistor comprises a floating gate tunnel oxide metal oxide semiconductor transistor.

7. The memory device of claim 4, wherein said second metal oxide semiconductor transistor and said capacitor are in a stack structure.

8. The memory device of claim 4, wherein said DRAM section is used for storing data that is frequently changed and said EEPROM section is used for storing data that is to be retained even when electrical power to said memory device is removed.

9. The memory device of claim 8, wherein said data to be retrained is transferred from said DRAM section to said EEPROM section.

10. An electrically alterable, nonvolatile memory device, comprising:
    a DRAM section having a capacitor that functions to store data as long as electrical power is supplied to said memory device and a first transistor;
    an EEPROM section comprising a second transistor, said second transistor having a floating gate electrode that is used for holding said data in said EEPROM section, said EEPROM section having a control gate electrode that transfers data from said DRAM section to said EEPROM section, a first capacitor electrode of said DRAM section of said capacitor being provided over said insulation layer such that said control gate electrode is also a second capacitor electrode of said capacitor, said control gate electrode being connected to a source of said first transistor and a drain of said second transistor.

11. The memory device of claim 10, wherein said DRAM comprises a metal oxide semiconductor transistor.

12. The memory device of claim 10, wherein said EEPROM section comprises a floating gate tunnel oxide metal oxide semiconductor transistor.

13. The memory device of claim 10, wherein said EEPROM section and said capacitor are in a stack structure.

* * * * *